United States Patent
Akiyama et al.

(10) Patent No.: US 8,434,538 B2
(45) Date of Patent: May 7, 2013

(54) BONDING APPARATUS AND BONDING METHOD

(75) Inventors: Naoki Akiyama, Nirasaki (JP);
Masahiko Sugiyama, Nirasaki (JP);
Yosuke Omori, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 10 days.

(21) Appl. No.: 13/284,434

(22) Filed: Oct. 28, 2011

(65) Prior Publication Data

US 2012/0103533 A1 May 3, 2012

(30) Foreign Application Priority Data

Oct. 29, 2010 (JP) .................................. 2010-243516

(51) Int. Cl.
*B32B 37/00* (2006.01)
(52) U.S. Cl.
USPC ........................ 156/382; 156/581; 156/583.1
(58) Field of Classification Search .................. 156/228, 156/381, 382, 580, 581, 583.1
See application file for complete search history.

(56) References Cited

U.S. PATENT DOCUMENTS

| | | | |
|---|---|---|---|
| 5,472,556 A * | 12/1995 | Sanko | 156/498 |
| 7,147,027 B2 * | 12/2006 | Kano et al. | 156/382 |
| 8,210,417 B2 * | 7/2012 | Akiyama et al. | 228/6.2 |
| 8,286,853 B2 * | 10/2012 | Akiyama et al. | 228/180.21 |

FOREIGN PATENT DOCUMENTS

| | | |
|---|---|---|
| JP | 2004-207436 A | 7/2004 |
| WO | 2010/055730 A1 | 5/2010 |

* cited by examiner

*Primary Examiner* — James Sells
(74) *Attorney, Agent, or Firm* — Nath, Goldberg & Meyer; Jerald L. Meyer

(57) ABSTRACT

A bonding apparatus has an upper chuck and a lower chuck for holding wafers. The upper chuck is configured such that the center portion is bent to be convex when pressurized with a predetermined pressure. On the bottom surface of the lower chuck, there is an insulating ring formed of a combination of a plurality of insulating members to support the periphery of the lower chuck. The bottom surface of the insulating ring is supported by a support ring formed of a combination of a plurality of supporting members. The supporting members and the lower chuck are fixed by a bolt provided for each of the supporting members. The bolt is inserted through a through hole and a through hole which are formed in the insulating members and the supporting members, respectively, the through holes having a diameter larger than a diameter of the bolt.

4 Claims, 8 Drawing Sheets

| | (μm) |
|---|---|
| Y1 | 83 |
| Y2 | 83 |
| Y3 | 85 |
| Y4 | 83 |
| Y5 | 85 |
| Y6 | 85 |
| Y7 | 84 |

BONDING APPARATUS AND BONDING METHOD

CROSS-REFERENCE TO RELATED APPLICATION

This application claims the benefit of Japanese Patent Application No. 2010-243516, filed on Oct. 29, 2010, in the Japanese Patent Office, the disclosure of which is incorporated herein in its entirety by reference.

TECHNICAL FIELD

The present disclosure relates to a bonding apparatus which bonds two thin plate-like members together and a bonding method using the bonding apparatus.

BACKGROUND

In recent years, semiconductor wafers (hereinafter, referred to as "wafers") are increasing in their diameter in manufacturing semiconductor devices or micro electromechanical systems (MEMSs). In addition, there is a desire to make wafers thin in a specified process such as mounting or the like. However, a large-diameter wafer is likely to be bent or cracked if the wafer is carried or polished as it is. Therefore, in order to reinforce the wafer, the wafer is bonded to a reinforcing substrate, for example, another wafer having the same shape and size as the wafer. Typically, the two wafers are bonded together using an adhesive.

However, such bonding between the two wafers using the adhesive is likely to generate voids due to air introduced between the two wafers. Such voids generated between the two wafers may deteriorate performance of semiconductor devices to be manufactured and, therefore, there is a need to suppress the generation of voids.

To overcome this problem, in a related art, there has been proposed a bonding apparatus including a chamber which accommodates two wafers vertically arranged (hereinafter, a wafer in an upper side is referred to as an "upper wafer" and a wafer in a lower side is referred to as a "lower wafer"), pressing pins which are provided within the chamber and press the center of the upper wafer, and a spacer which supports the outer periphery of the upper wafer and can be moved back from the outer periphery of the upper wafer.

In this bonding apparatus, in order to prevent voids from occurring between the two wafers, the wafers are bonded together with the interior of the chamber exhausted and decompressed. Such bonding between the wafers is performed by first pressing the center of the upper wafer by means of the pressing pins with the upper wafer supported by the spacer, contacting the center to the lower wafer, moving the spacer supporting the upper wafer back from the upper wafer, and then contacting the entire surface of the upper wafer to the entire surface of the lower wafer.

However, this bonding apparatus requires the chamber to be under a decompressed state during the entire bonding process. This process consumes much time from the time the wafers are moved into the chamber to the exhaustion of the entire interior of the chamber and the decompression of the chamber to a predetermined pressure, which results in a low throughput of wafer processing.

Therefore, there has been proposed a technique in which the center of an upper chuck holding an upper wafer is bent with a predetermined pressure by exhausting the interior of a narrow sealed space formed by making close contact between the upper chuck and a lower chuck, thereby first contacting the center of the upper wafer with the center of a reinforcing substrate or the lower wafer, and then a bonding process is performed by contacting both wafers together sequentially from their centers to their outsides in a radial direction.

In the above-described wafer bonding processes, the wafers are bonded together with the adhesive melted into a liquid state by heating the adhesive to its melting point or above. Accordingly, for example, a heater as a heating mechanism is contained in the lower chuck and the adhesive applied on the lower wafer is heated by the heater.

However, the present inventors have performed the wafer bonding process as known in the art, and have discovered that there are some cases where voids occur between the wafers even in the case of bonding the wafers in the decompressed space.

The present inventors have examined this discovery and have found that the voids are attributed to thermal expansion of the lower chuck due to heating by the heater. In more detail, as shown in FIG. 15, the periphery of a lower chuck 101 embedded with a heater 100 is supported by an annular support 102 made of, for example, stainless steel. The lower chuck 101 and the support 102 are fixed by a plurality of bolts 103 concentrically arranged. The support 102 is fixed to a pedestal (not shown) by means of a plurality of other bolts.

It has been observed that the outer periphery of the top of the lower chuck 101 is deformed into a wavy state when the temperature of the heater 100 is increased. In this regard, the present inventors have calculated, through a simulation using numerical analysis, a degree of displacement of the outer periphery of the top of the lower chuck 101 when the temperature of the heater is increased to 210 degrees Celsius and have obtained the results shown in the table of FIG. 16. This simulation can use universal software for thermo structure analysis. In FIG. 16, X1 to X12 shown in the left side of the table represent measuring points of the degree of displacement and numerical values shown in the right side of the table represent the degree of displacement (in the unit of µm) in the vertical direction at the measuring points. The lower chuck 101 shown in FIG. 16 is fixed to the support 102 by means of six (6) bolts 103.

It can be seen from this result that a degree of displacement due to thermal expansion at positions corresponding to the bolts 103 is relatively small, whereas a degree of displacement is increased by a maximum of 30 µm at positions between the bolts 103, as compared to the positions corresponding to the bolts 103. The reason why the degree of displacement due to thermal expansion at the positions corresponding to the bolts 103 decreases is that the extension of the lower chuck 101 due to thermal expansion is restrained by the bolts 103. Accordingly, it is believed that the outer periphery of the top of the lower chuck 101 is deformed into a wavy state. As a result, it is inferred that airtightness by close adhesion of the upper chuck to the lower chuck at the positions corresponding to the bolts 103 is reduced and there is a high possibility of generating voids in the vicinity of the positions.

SUMMARY

According to one embodiment of the present disclosure, there is provided a bonding apparatus for bonding two thin plate members together, including: a first holder which holds a first thin plate member on a top surface thereof; a heating mechanism which is provided within the first holder; a second holder which is provided above the first holder opposite the first holder and which holds a second thin plate member on a bottom surface of the second holder; an exhausting mechanism which exhausts the interior of a space surrounded by the first holder and the second holder when the first holder contacts the second holder; a pressing mechanism which is provided on top of the second holder and presses the second holder downward; an annular first support including a plurality of first supporting members to support a bottom outer periphery of the first holder; and an annular second support including a plurality of second supporting members to support the bottom of the first support, wherein the second holder is configured such that one portion of the second holder is bent with a predetermined pressure, the second support and the first holder are fixed by one fixing member provided for each of the second supporting members, and the fixing member is inserted through a through hole which is formed in each of the second supporting members, the through hole having a diameter larger than a diameter of the fixing member.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
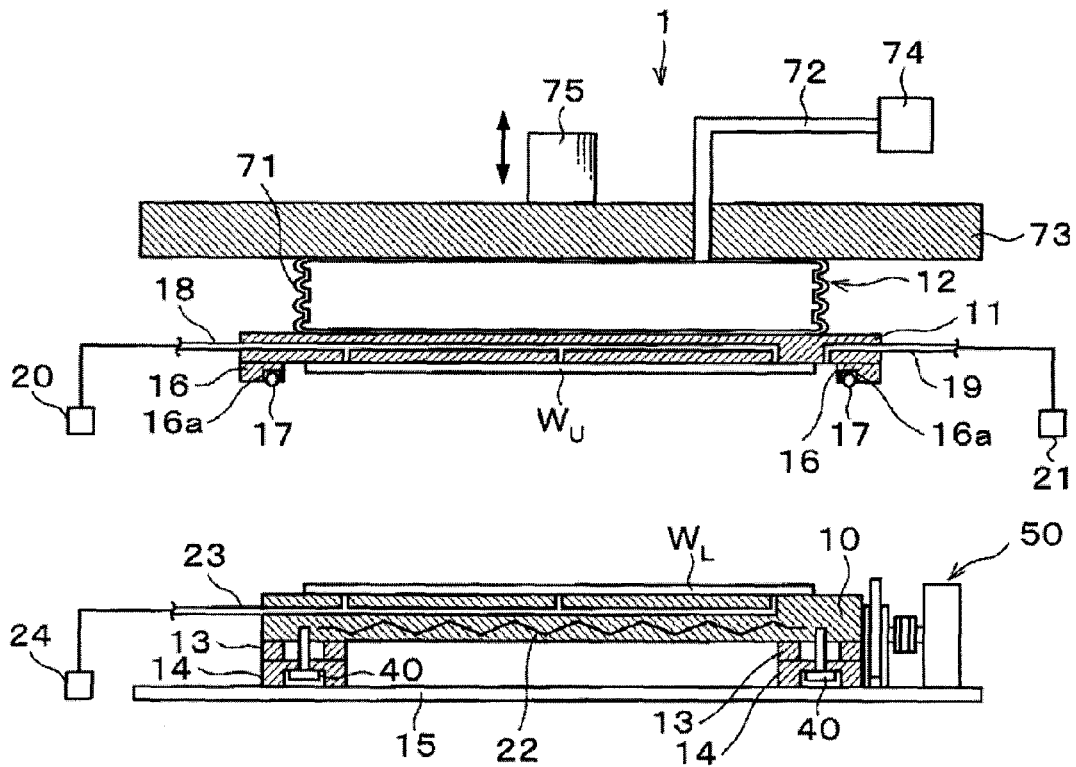
FIG. 1 is a schematic longitudinal sectional view showing a configuration of a bonding apparatus according to one embodiment of the present disclosure.

Embodiments of the present disclosure will now be described in detail with reference to the drawings. FIG. 1 is a schematic longitudinal sectional view showing a configuration of a bonding apparatus 1 according to one embodiment of the present disclosure.

The bonding apparatus 1 includes a lower chuck 10 as a first holder which holds a lower wafer $W_L$ as a first thin plate member on the top surface of the lower chuck 10, and an upper chuck 11 as a second holder which holds an upper wafer $W_U$ as a second thin plate member on the bottom surface of the upper chuck 11. The upper chuck 11 is arranged above the lower chuck 10 in such a manner that the upper chuck 11 faces the lower chuck 10. Thus, the lower wafer $W_L$ held by the lower chuck 10 faces the upper wafer $W_U$ held by the upper chuck 11. In this embodiment, the lower wafer $W_L$ has the same diameter as the upper wafer $W_U$.

A pressing mechanism 12 to press the upper chuck 11 vertically is provided on the top of the upper chuck 11. Details of the pressing mechanism 12 will be described later. An annular insulating ring 13 as a first support which is made of, for example, material having a high insulation property, such as ceramics or the like, is provided on the bottom of the lower chuck 10. The bottom of the outer periphery of the lower chuck 10 is supported by the insulating ring 13. A support ring 14 as a second support is provided on the bottom of the insulating ring 13. The bottom of the support ring 14 is supported by a pedestal 15. The support ring 14 and the pedestal 15 are made of, for example, stainless steel.

Figure 2:
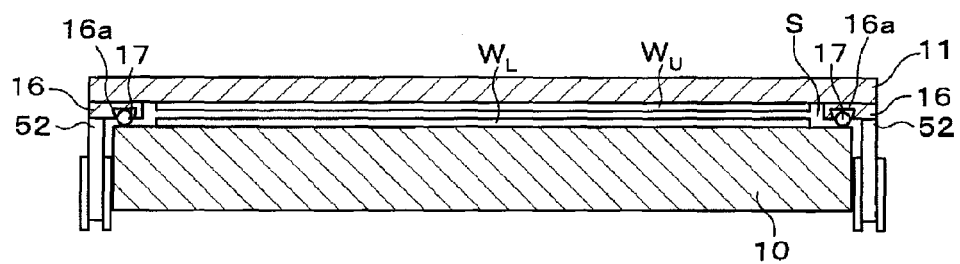
FIG. 2 is an explanatory view showing a state where an upper chuck is lowered.

An annular projection 16 projecting downward is formed on the bottom of the outer periphery of the upper chuck 11. The projection 16 may be integrated with the upper chuck 11. An annular groove 16a is formed on the bottom of the projection 16. An annular sealant 17 is arranged in the groove 16a. Accordingly, when the upper chuck 11 is moved downward to make contact with the projection 16 or the sealant 17 of the projection 16 with the periphery of the top of the lower chuck 10, a bonding space S for bonding the lower wafer $W_L$ to the upper wafer $W_U$ is formed in a region surrounded by the upper chuck 11, the projection 16 and the lower chuck 10, as shown in FIG. 2. The annular groove 16a is formed to be larger in volume than the sealant 17. Accordingly, when the upper chuck 11 is pressed toward the lower chuck 10 by means of a pressurized container 71, the sealant 17 is elastically deformed and accommodated in the groove 16a.

The material and thickness of the upper chuck 11 are selected or set such that a portion of the top of the upper chuck 11 is bent downward to be convex when a pressure is applied to the top of the upper chuck 11. In this embodiment, the upper chuck 11 is made of, for example, aluminum and has thickness of 16 mm. Accordingly, for example, when a pressure of 0.07 MPa is applied to the top of the upper chuck 11, the center of the top of the upper chuck 11 is bent downward by 0.2 mm to be convex. In this embodiment, the pressure is expressed as a gauge pressure unless stated otherwise. That is, the atmospheric pressure is 0 (zero) MPa and the above-mentioned 0.07 MPa indicates atmospheric pressure plus 0.07 MPa.

An absorbing pipe 18 for adsorbing the upper wafer $W_U$ and an exhausting pipe 19 for exhausting the interior of the above-mentioned bonding space S are provided within the upper chuck 11. The absorbing pipe 18 and the exhausting pipe 19 are connected to exhausters 20 and 21 such as, for example, vacuum pumps or the like, respectively. One end of the exhausting pipe 19 communicates to a place where the upper wafer $W_U$ in the bottom of the upper chuck 11 is not held, for example, to the neighborhood of the projection 16. In this embodiment, the exhausting pipe 19 and the exhauster 21 constitutes an exhaustion mechanism.

As shown in FIG. 1, a heating mechanism 22 for heating the lower wafer $W_L$ and an absorbing pipe 23 for adsorbing the lower wafer $W_L$ are provided within the lower chuck 10. The heating mechanism 22 may be, for example, a heater. The absorbing pipe 23 is connected to an exhauster 24 such as a vacuum pump or the like, in the same manner as the absorbing pipe 18. The lower chuck 10 is made of for example, aluminum and its thickness is set such that it is not deformed even when a load is applied by means of the pressing mechanism 12 in bonding the upper wafer $W_U$ to the lower wafer $W_L$.

Figure 3:
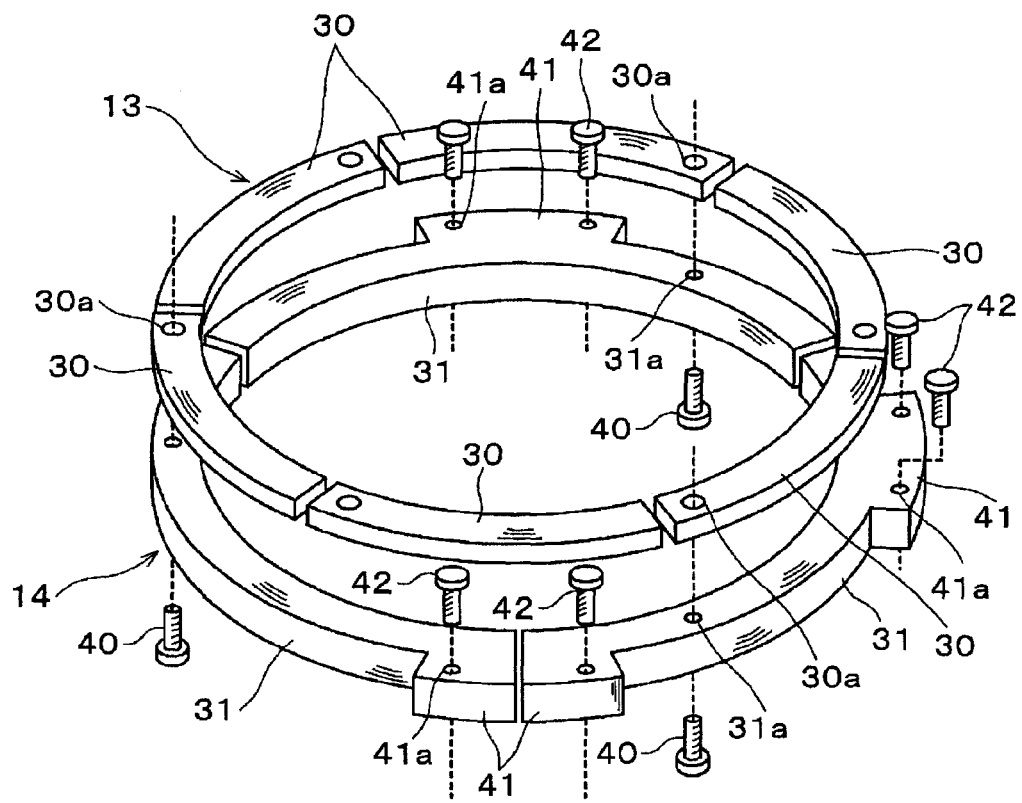
FIG. 3 is a schematic perspective view showing a configuration of an insulating ring and a support ring.

The annular insulating ring 13 supporting the bottom of the lower chuck 10 includes a plurality of arc-like insulating members 30 as first support members, for example, as shown in FIG. 3. The annular support ring 14 supporting the bottom of the insulating ring 13 includes a plurality of arc-like support members 31 as second support members. Although FIG. 3 shows the insulating ring 13 being made up of six (6) insulating members 30 and the support ring 14 being made up of three (3) support members 31, the number of insulating members 30 required to constitute the insulating ring 13 and the number of support members 31 required to constitute the support ring 14 are not limited to this embodiment but may be selected as appropriate.

Figure 4:
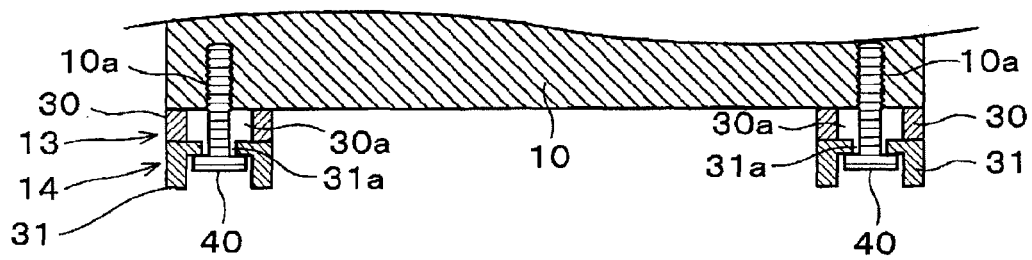
FIG. 4 is a schematic longitudinal sectional view showing a configuration of the area around the insulating ring and the support ring.

As shown in FIG. 4, each insulating member 30 has a through hole 30a, and each support member 31 has a through hole 31a, respectively. The through holes 30a and 31a vertically penetrate through each insulating member 30 and each support member 31, respectively. The lower chuck 10 is fixed to each support member 31 by joining a fastening member, for example, a bolt 40, which is inserted through the through holes 30a and 31a, into a screw hole 10a formed on the bottom of the lower chuck 10. As shown in FIG. 3, each support member 31 is fixed to the lower chuck 10 by means of one bolt 40. The through holes 30a and 31a have a diameter larger than that of the bolt 40. Accordingly, each insulating member 30 is not directly fixed by the bolt 40 but is fitted between each support member 31 and the lower chuck 10 by fastening the bolt 40.

Figure 5:
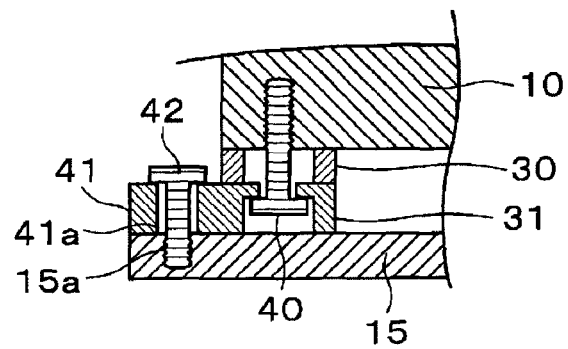
FIG. 5 is a schematic longitudinal sectional view showing a configuration of the area around the support ring and a pedestal.

In addition, as shown in FIG. 3, a bracket 41 projecting outwardly in the radial direction of the support member 31 is provided in the outer side of each support member 31. The bracket 41 is formed with a through hole 41a vertically penetrating through the bracket 41. As shown in FIG. 5, each support member 31 is disposed on the pedestal 15 by joining a bolt 42, which is inserted through the through hole 41a, into a screw hole 15a formed on the top of the pedestal 15. The through hole 41a has a diameter larger than that of the bolt 42.

In this manner, since one support member 31 is fixed to the lower chuck 10 by means of one bolt 40 and the bolt 40 is inserted through the through holes 30a and 31a having the diameter larger than that of the bolt 40, for example even when a volume of the lower chuck 10 is changed due to thermal expansion, each support member 31 and each insulating member 30 can be moved to follow such a change in volume of the lower chuck 10. This can prevent extension of the lower chuck 10 by thermal expansion from being restrained by the bolt 40. In addition, also in the case of the support member 31 and the pedestal 15, the bolt 42 are inserted through the through hole 41a having a diameter larger than that of the bolt 42, which prevents extension of the lower chuck 10 from being restrained by the bolt 42.

In addition, in this embodiment, since the support ring 14 is formed of three (3) support members 31, the support ring 14 and the lower chuck 10 are fixed by three (3) bolts 40. On the other hand, the insulating ring 13 is formed of six (6) insulating members 30. In this case, since the three bolts 40 are inserted through the corresponding three insulating members 30 among the six (6) insulating members 30, it is sufficient if the through holes 30a are formed in the 3 insulating members 30. However, as shown in FIG. 3, the through holes 30a may be formed in all of the six (6) insulating members 30.

Figure 6:
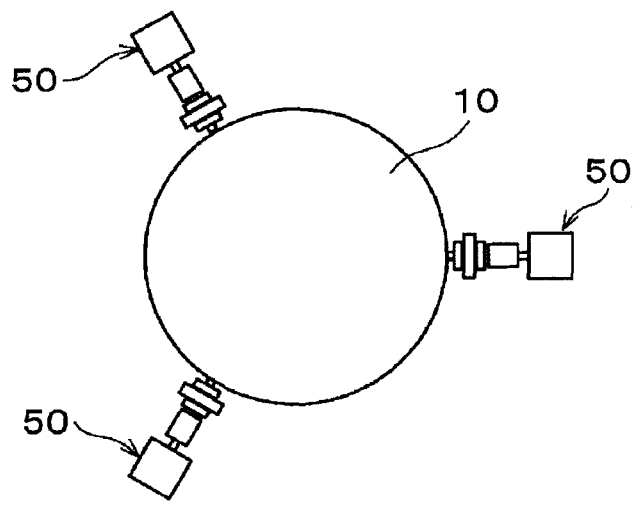
FIG. 6 is a schematic plan view showing a configuration of the area around a lower chuck.

A plurality of (for example, three) height adjustment mechanisms 50 is concentrically disposed along the periphery of the lower chuck 10 when viewed from the top of the pedestal 15, as shown in FIG. 6. The height adjustment mechanisms 50 are to adjust a vertical distance between the lower wafer $W_L$ and the upper wafer $W_U$ with high precision by adjusting the height of the upper chuck 11 while supporting the surroundings of the projection 16.

Figure 7:
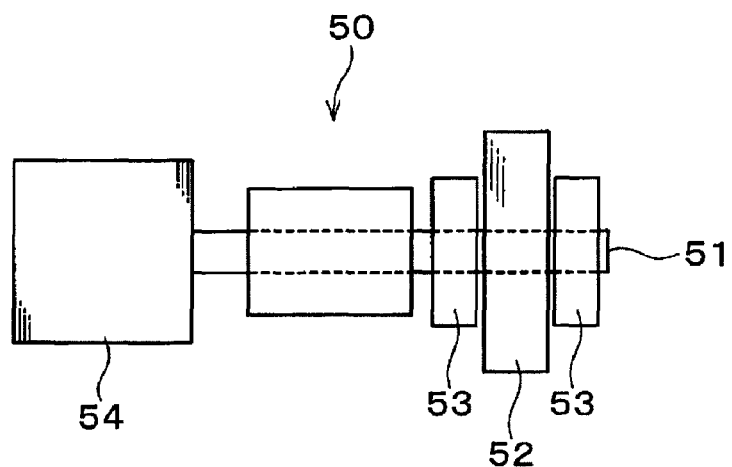
FIG. 7 is a schematic plan view showing a configuration of a height adjustment mechanism.
Figure 8:
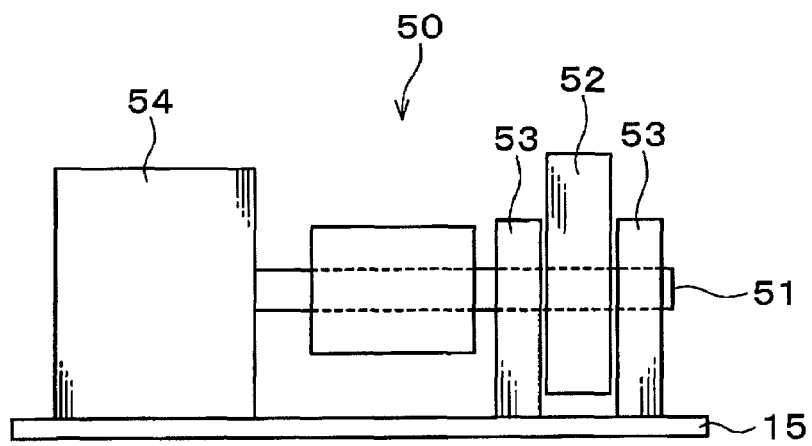
FIG. 8 is a schematic side view showing a configuration of the height adjustment mechanism.
Figure 9:
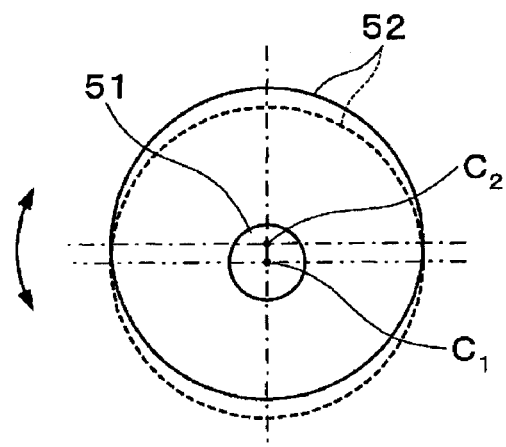
FIG. 9 is an explanatory view showing a relationship between an eccentric roll and a rotating shaft.

Each of the height adjustment mechanisms 50 has a disc-like eccentric roll 52 fixed by a rotating shaft 51, for example as shown in FIGS. 7 and 8. The rotating shaft 51 is supported by a roll support frame 53 provided on the top of the pedestal 15. A rotation driver 54 for rotating the rotating shaft 51 is connected to one end of the rotating shaft 51. The center $C_1$ of the rotating shaft 51 is eccentric from the center $C_2$ of the eccentric roll 52, for example as shown in FIG. 9. Accordingly, when the rotating shaft 51 is rotated, the height of an apex in the vertical direction of the eccentric roll 52, that is, the height of a contact point with the projection 16, can be adjusted. This allows a position of the upper chuck 11 in its height direction to be adjusted with high precision. The height adjustment mechanisms 50 is arranged such that the eccentric roll 52 contacts the outer side of the sealant 17 in the projection 16, for example as shown in FIG. 2. In this embodiment, the projection 16, the sealant 17 and the height adjustment mechanisms 50 constitute an airtightness maintaining mechanism. The number of height adjustment mechanisms 50 is not limited to this embodiment but may be three or more.

The pressing mechanism 12 includes a cylindrical hollow pressurized container 71 provided to cover the upper wafer $W_U$ and the lower wafer $W_L$, and a fluid feeding pipe 72 for feeding a fluid, for example, compressed air, into the pressurized container 71, as shown in FIG. 1. The pressurized container 71 is formed of, for example, a stainless steel-made bellows which is not damaged by pressure from the compressed air fed therein and can be vertically expanded/contracted. The bottom of the pressurized container 71 contacts the top of the upper chuck 11. The top of the pressurized container 71 is attached to the bottom of a support plate 73 provided above the upper chuck 11.

The fluid feeding pipe 72 has one end connected to the pressurized container 71 and the other end connected to a fluid source 74. The pressurized container 71 is expanded by feeding, for example, the compressed air from the fluid source 74 into the pressurized container 71 via the fluid feeding pipe 72. At this time, since the top of the pressurized container 71 contacts the bottom of the support plate 73, the pressurized container 71 is expanded downward to press down the upper chuck 11 provided in the bottom of the pressurized container 71. In addition, since the interior of the pressurized container 71 is pressurized by the fluid, the pressurized container 71 can press the inner-plane of the upper chuck 11 uniformly. A load for pressing the upper chuck 11 is adjusted by controlling the pressure of the compressed air fed into the pressurized container 71. The material and thickness of the support plate 73 are selected or set such that it is not deformed in response to a reaction produced when the upper chuck 11 is pressed by the pressurized container 71.

An elevating mechanism 75 to elevate the support plate 73 is disposed on the top of the support 73. Accordingly, as the support plate 73 is elevated by the elevating mechanism 75, the support plate 73 can elevate the pressurized container 71 and the upper chuck 11. This allows adjustment of a distance between the projection 16 in the bottom of the upper chuck 11 and the top of the lower chuck 10. The covering of the upper wafer $W_U$ and the lower wafer $W_L$ with the pressurized container 71 means that the pressurized container 71 has the same diameter as those of the upper wafer $W_U$ and the lower wafer $W_L$, for example. As used herein, the diameter of the pressurized container 71 indicates a diameter of a portion of the pressurized container 71 which contacts the upper chuck 11. In this manner, as the pressurized container 71 has the same diameter as those of the upper wafer $W_U$ and the lower wafer $W_L$, a pressure is uniformly applied to the inner-plane of the upper wafer $W_U$ and the lower wafer $W_L$ when the pressurized container 71 presses the upper wafer $W_U$ and the lower wafer $W_L$.

Figure 10:
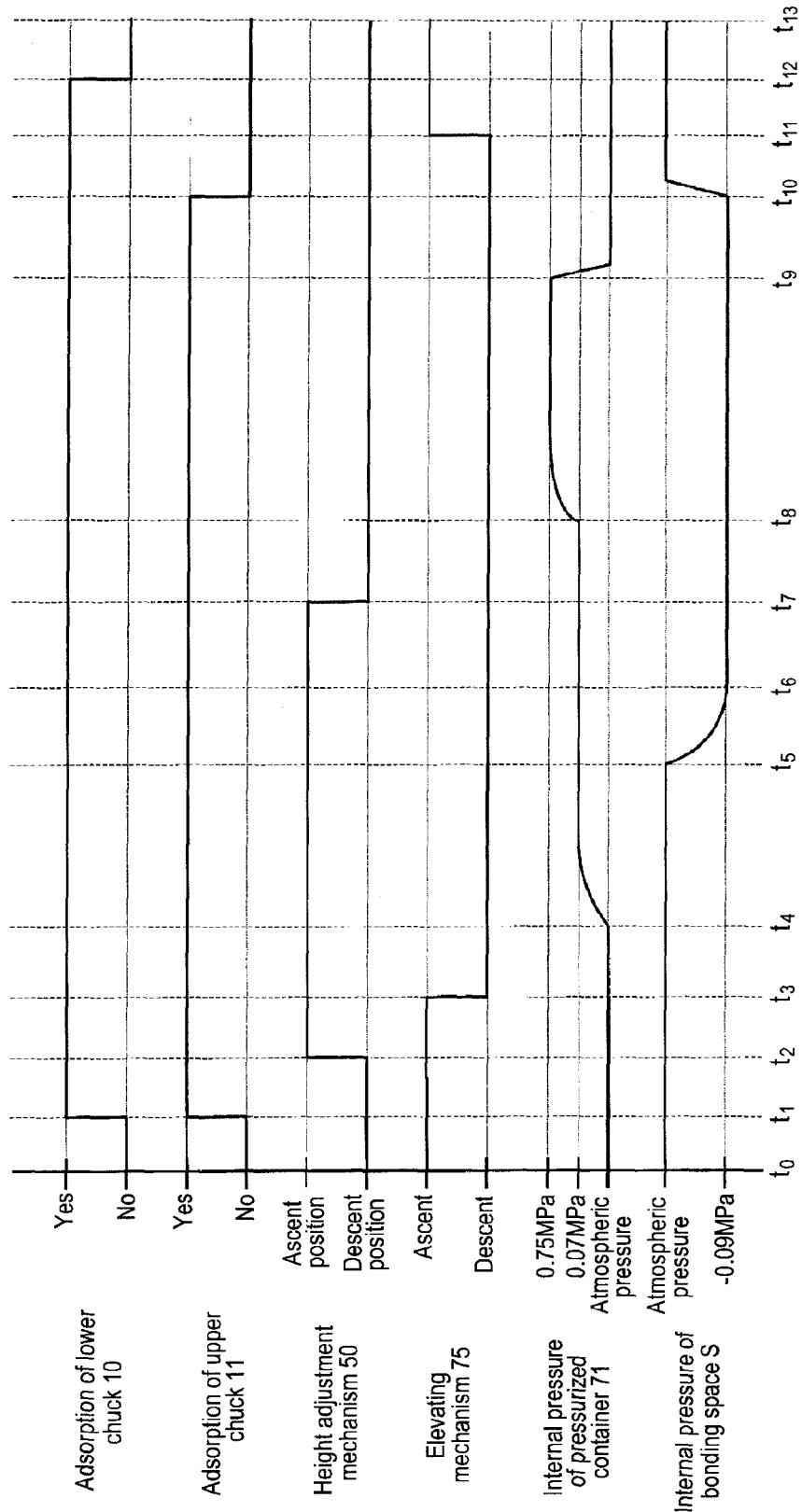
FIG. 10 is a time chart showing operation of various components of the bonding apparatus.

Now, a method of bonding the upper wafer $W_U$ and the lower wafer $W_L$ together using the above-configured bonding apparatus 1 of this embodiment will be described with reference to FIG. 10. FIG. 10 is a time chart showing operation of various components of the bonding apparatus 1. In this figure, a vertical axis represents the operation of components of the bonding apparatus 1 and a horizontal axis represents time ($t_0$ to $t_{13}$).

In performing the bonding method, it is assumed that an adhesive is beforehand applied on the top of the lower wafer $W_L$.

Prior to bonding the upper wafer $W_U$ and the lower wafer $W_L$ together, the heating mechanism 22 is heated to a predetermined temperature. The predetermined temperature may be, for example, 250 degrees Celsius which is equal to or higher than the melting point of the adhesive. The heating of the heating mechanism 22 increases the volume of the lower chuck 10 due to thermal expansion. In this embodiment, as described above, each of the insulating members 30 constituting the insulating ring 13 and each of the support members 31 constituting the support ring 14 are fixed to the lower chuck 10 by means of one bolt 40, respectively, and the bolt 40 is inserted through the through holes 30a and 31a having a diameter larger than that of the bolt 40. Accordingly, the bolt 40 and the insulating ring 13 can be moved to follow the change in volume of the lower chuck 10 due to thermal expansion. In addition, the bolt 42 to fix the support member 31 and the pedestal 15 is also inserted through the through hole 41a having a diameter larger than that of the bolt 42. Accordingly, the lower chuck 10 can be uniformly expanded in all directions without being restrained to its apex by these bolts 40 and 42. This can prevent a wave-like deformation of the periphery of the top of the lower chuck 10, as shown in conventional techniques.

First, at time $t_1$ shown in FIG. 10, the lower wafer $W_L$ is loaded and adsorbed on the lower chuck 10 under the state where the lower chuck 10 is vertically separated from the upper chuck 11, as shown in FIG. 1. At the same time, the upper wafer $W_U$ is adsorbed on the upper chuck 11. At this time, the upper wafer $W_U$ is adsorbed by the upper chuck 11 with a negative pressure of −0.09 MPa.

Next, at time $t_2$, the eccentric roll 52 of the height adjustment mechanism 50 is rotated to adjust the top of the eccentric roll 52 to a predetermined height. As used herein, the predetermined height refers to a height at which the sealant 17 contacts the lower chuck 10 when the bottom of the projection 16 of the upper chuck 11 contacts the top of the eccentric roll 52, and the center of the upper wafer $W_U$ contacts the lower wafer $W_L$ when the center of the upper wafer $W_U$ adsorbed on the upper chuck 11 is bent by applying a predetermined pressure to the top of the upper chuck 11. The height in FIG. 10 is expressed by "ascent position." "Descent position" expressed in FIG. 10 means a height at which the eccentric roll 52 makes no contact with the bottom of the projection 16 even when the bottom of the projection 16 contacts the top of the lower chuck 10.

Subsequently, at time $t_3$, the elevating mechanism 75 is actuated to lower the upper chuck 11 and make contact with the bottom of the projection 16 with the top of the eccentric roll 52 of the height adjustment mechanism 50, as shown in FIG. 2. In this step, the sealant 17 of the projection 16 is adhered closely to the periphery of the top of the lower chuck 10 and a sealed bonding space S is formed between the lower chuck 10 and the upper chuck 11.

Figure 11:
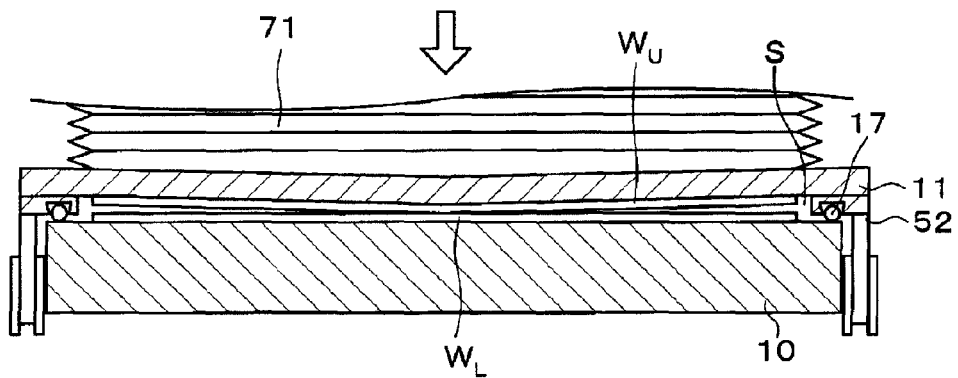
FIG. 11 is an explanatory view showing an upper chuck whose center is bent.

Thereafter, at time $t_4$, compressed air having a pressure of 0.07 MPa begins to be fed into the pressurized container 71 and the top of the upper chuck 11 is pressed by the pressing mechanism 12 with a pressure of 0.07 MPa. Thus, as shown in FIG. 11, the center of the upper chuck 11 is bent downward to be convex and the center of the upper wafer $W_U$ adsorbed on the upper chuck 11 is accordingly bent downward to be convex. This allows the center of the upper wafer $W_U$ to make contact with the lower wafer $W_L$. In the meantime, the upper wafer $W_U$ remains adsorbed on the upper chuck 11 since the bonding space S is still kept at atmospheric pressure.

Figure 12:
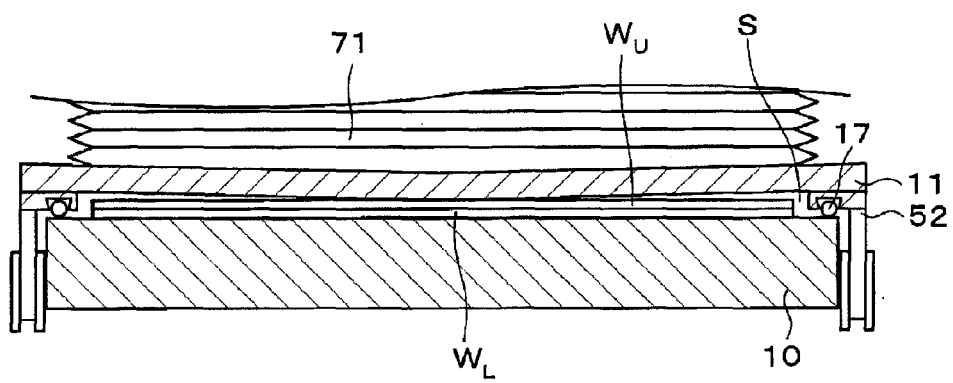
FIG. 12 is an explanatory view showing a state where the entire surface of an upper wafer contacts the entire surface of a lower wafer.

Subsequently, at time $t_5$, the interior of the bonding space S begins to be exhausted via the exhausting pipe 19. When the internal pressure of the bonding space S becomes −0.09 MPa or less (at time $t_6$), the upper chuck 11 cannot keep the upper wafer $W_U$ adsorbed any longer. Accordingly, the upper wafer $W_U$ bent along the upper chuck 11 by being adsorbed on the upper chuck 11 begins to return to its original flat state. Then, the upper wafer $W_U$ makes contact with the lower wafer $W_L$ sequentially from its center to its outside in the radial direction and, finally, the entire surface of the upper wafer $W_U$ contacts the entire surface of the lower wafer $W_L$, as shown in FIG. 12. Thus, the upper wafer $W_U$ and the lower wafer $W_L$ are bonded together by means of the adhesive.

Figure 13:
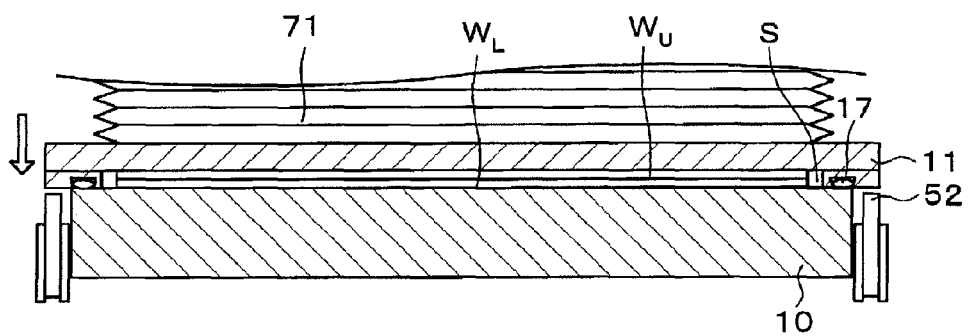
FIG. 13 is an explanatory view showing a state where an upper wafer and a lower wafer are bonded together.

Thereafter, at time $t_7$, as shown in FIG. 13, the height of the eccentric roll 52 is adjusted to a lower position by means of the height adjustment mechanism 50 and the bottom of the upper chuck 11 is in contact with the entire surface of the upper wafer $W_U$. At this time, the sealant 17 is elastically deformed to be accommodated in the groove 16a of the projection 16 and the bottom of the projection 16 is adhered closely to the top of the lower chuck 10.

Thereafter, at time $t_8$, the pressure of the compressed air fed into the pressurized container 71 begins to increase and the upper chuck 11 is pressed down for a predetermined period of time with a predetermined pressure, for example, 0.75 MPa. This allows the upper wafer $W_U$ and the lower wafer $W_L$, to be more strongly adhered to each other, completing the bonding between the upper wafer $W_U$ and the lower wafer $W_L$.

In this manner, upon completing the bonding between the upper wafer $W_U$ and the lower wafer $W_L$, at time $t_9$, the feeding of the compressed air is stopped and the internal pressure of the pressurized container 71 returns to atmospheric pressure. Next, at time $t_{10}$, the exhaustion by the exhausting pipe 19 is stopped and the internal pressure of the bonding space S returns to atmospheric pressure. In addition, the adsorption of the upper wafer $W_U$ by the absorbing pipe 18 is stopped.

Thereafter, at time $t_{11}$, the support plate 73 is elevated by the elevating mechanism 75 and the lower chuck 10 is separated from the upper chuck 11. Next, at time $t_{12}$, the adsorption of the lower wafer $W_L$ is stopped. Thereafter, the upper wafer $W_U$ and the lower wafer $W_L$ as bonded together are carried out of the bonding apparatus 1.

As described above, according to this embodiment, the bonding space S is in the atmospheric state at the initial stage of bonding and the center of the upper wafer $W_U$ and the center of the lower wafer $W_L$ contact each other from pressure exerted by the pressurized container 71. After the center of the upper wafer $W_U$ and the center of the lower wafer $W_L$ contact each other, the interior of the bonding space S is exhausted into a decompressed state, thereby gradually spreading a contact portion from their centers to their outsides in the radial direction, which results in the contact between the entire surface of the upper wafer $W_U$ and the entire surface of the lower wafer $W_L$. Accordingly, it is possible to prevent voids from occurring between the upper wafer $W_U$ and the lower wafer $W_L$.

In addition, since the lower chuck 10 and the support ring 14 are fixed by one bolt 40 provided for each of the support members 30 constituting the support ring 14 and the bolt 40 is inserted through the through holes 30a and 31a having a diameter larger than that of the bolt 40, each bolt 40 can be moved to follow the change in volume of the lower chuck 10 due to thermal expansion. This can prevent extension of the lower chuck 10 by thermal expansion from being restrained by the bolt 40. Accordingly, it is possible to prevent the outer periphery of the top of the lower chuck 10 from being wavy due to thermal expansion when the upper wafer $W_U$ and the lower wafer $W_L$ are bonded together, and accordingly it is possible to prevent voids from occurring due to wave-like deformation of the outer periphery of the lower chuck 10 as described above.

In addition, since the insulating ring 13 made of ceramics having a high insulation property is interposed between the lower chuck 10 and the support ring 14, it is possible to minimize heat from being transferred from the lower chuck 10 to the outside.

Figure 14:
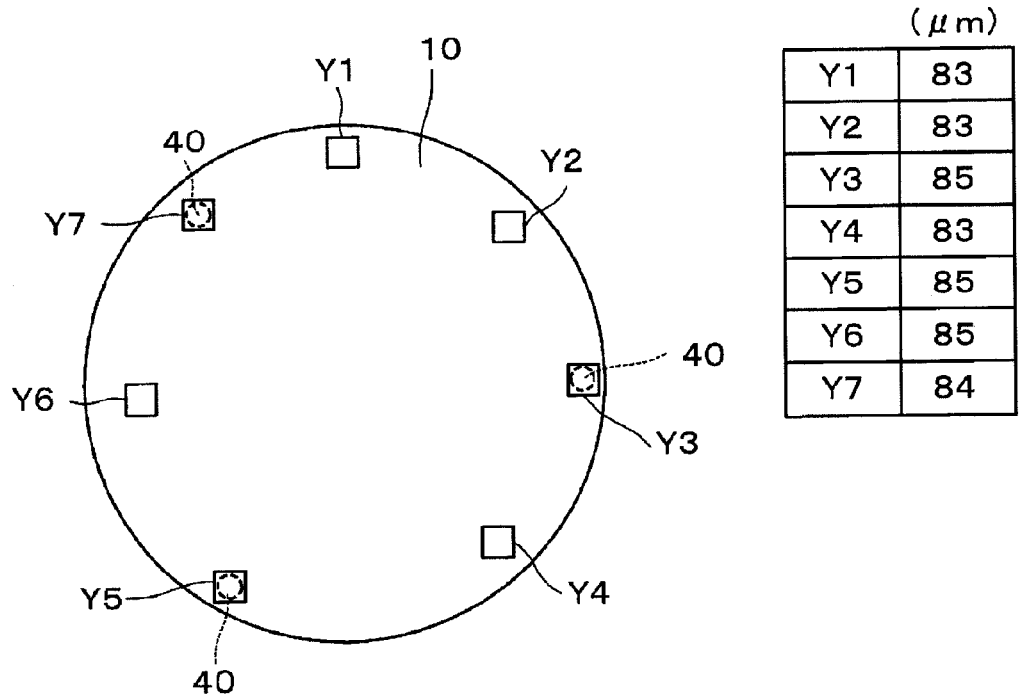
FIG. 14 is an explanatory view showing displacement of the periphery of the top of the lower chuck due to thermal expansion.
Figure 15:
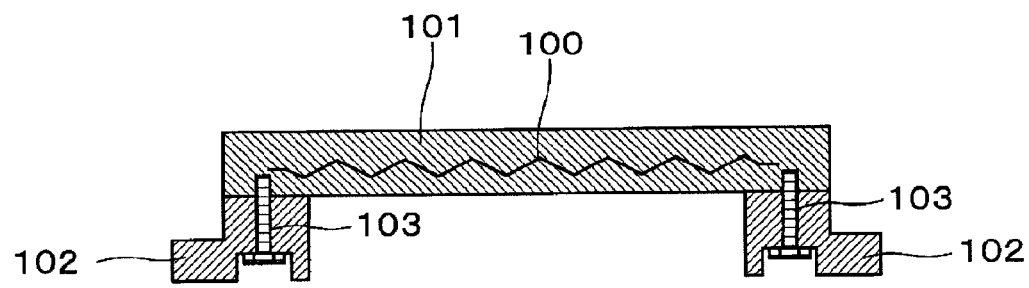
FIG. 15 is an explanatory view showing a general configuration of a conventional support.
Figure 16:
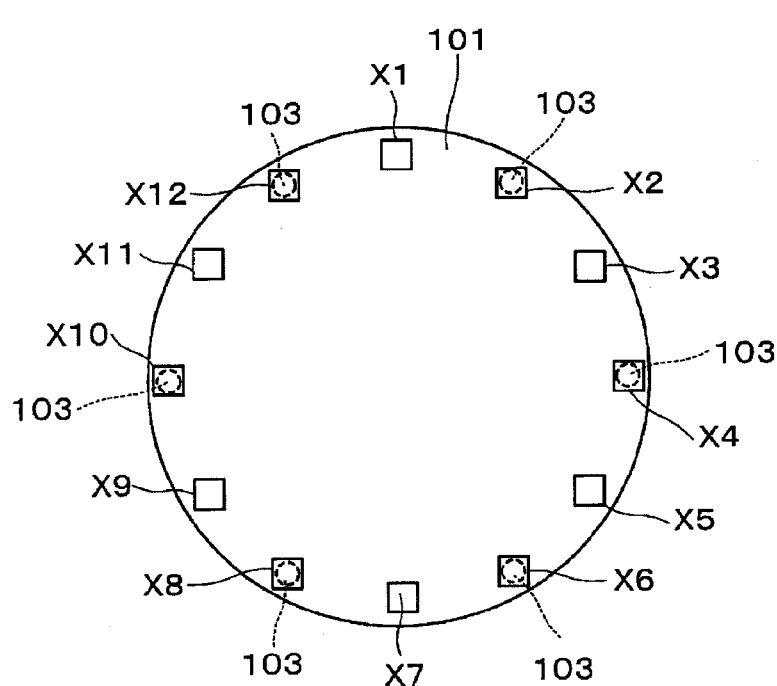
FIG. 16 is an explanatory view showing displacement of the periphery of the top of the lower chuck due to thermal expansion.

The present inventors have used the insulating ring 13 and the supporting ring 14 of this embodiment to calculate, through a simulation using numerical analysis, a degree of displacement of the top of the lower chuck 10 due to thermal expansion when the lower chuck 10 is fixed by the bolt 40. This simulation can use universal software for thermo structure analysis. At that time, the heating temperature of the lower chuck 10 was set to 250 degrees Celsius. A result of the simulation is shown in FIG. 14. In FIG. 14, Y1 to Y7 shown in the left side represent measuring points of the degree of displacement and numerical values shown in the right side represent the degree of displacement (in the unit of μm) of the top of the lower chuck 10 at the measuring points Y1 to Y7. It can be seen from FIG. 14 that the degree of displacement of the lower chuck 10 due to thermal expansion is suppressed such that a difference in degree of displacement between points Y3, Y5 and Y7 fixed by the bolt 40 and the other points Y1, Y2, Y4 and Y6 is 2 μm or so.

However, if the insulating ring 13 is made of, for example, integrated annular ceramics, such an integrated insulating ring 13 cannot be freely moved to follow the change in volume of the lower chuck 10 due to thermal expansion. As a result, there is a possibility of cracking and damage to the insulating ring 13. This is because ceramic is fragile and is apt to be broken. To avoid such a possibility, the insulating ring 13 of this embodiment is segmented into several insulating members 30 which are fitted between the lower chuck 10 and the support ring 14. Accordingly, each of the insulating members 30 constituting the insulating ring 13 can be freely moved to follow the change in volume of the lower chuck 10 due to thermal expansion. Accordingly, it is possible to prevent the insulating ring 13 of this embodiment from being broken or damaged due to thermal expansion of the lower chuck 10.

Although in conventional bonding methods, the interior of the bonding space S is first exhausted and then the upper chuck 11 is bent downward to be convex using a pressure difference between the interior and the exterior of the bonding space S, in this embodiment, prior to exhausting the interior of the bonding space S, the upper chuck 11 is first pressed and bent by the pressing mechanism 12 when the interior of the bonding space S is in the atmospheric state.

In the bonding apparatus 1 of this embodiment, when the interior of the bonding space S is exhausted, a force to push the lower chuck 10 up is exerted to the lower chuck 10 due to a pressure difference between the interior and the exterior of the bonding space S. When such a force to push the lower chuck 10 up is exerted, there is a possibility that the lower chuck 10 floats upward due to this upward force. This is because the support members 31 are stretched upward through the bolt 40 due to the force to push the lower chuck 10 up and the support members 31 are accordingly bent upward with the bolt 42 fixing the support members 31 and the pedestal 15 as a supporting point. Thus, there is a possibility that the entire surface of the upper wafer $W_U$ makes contact with the entire surface of the lower wafer $W_L$ simultaneously and voids occur between the upper wafer $W_U$ and the lower wafer $W_L$. To avoid such a possibility, in this embodiment, the upper chuck 11 is pressed by the pressurized container 71 of the pressing mechanism 12 and is kept pressed under a state where the internal pressure of the bonding space S is the atmospheric pressure, as described above, that is, before time $t_5$ at which the exhausting procedure starts. Accordingly, even when the interior of the bonding space S begins to be exhausted at time $t_6$, there is no possibility that the lower chuck 10 floats. This can prevent voids from occurring between the upper wafer $W_U$ and the lower wafer $W_L$.

Although in the above embodiment the center of the top of the upper chuck 11 is bent with a predetermined pressure, the present invention is not limited thereto but other portions, for example, a portion separated by a predetermined distance from the center of the upper chuck 11, may be bent. When one portion of the top of the upper chuck 11 is bent, the upper wafer $W_U$ held by the upper chuck 11 contacts the lower wafer $W_L$ sequentially from the bent portion to the outside in the radial direction by exhausting the interior of the bonding space S. This also can prevent voids from occurring between the upper wafer $W_U$ and the lower wafer $W_L$.

In addition, although in the above embodiment the heating mechanism 22 is provided only in the lower chuck 10, the heating mechanism to heat the upper wafer $W_U$ may be disposed within the upper chuck 11.

Although in the above embodiment the bonding apparatus is used to bond the lower wafer and the upper wafer together, the bonding apparatus of this embodiment may be used to bond a wafer and a glass substrate together. In addition, the bonding apparatus may be used to bond a wafer and another wafer together or a chip and another chip together when a plurality of semiconductor devices is stacked. In addition, the bonding apparatus of the present disclosure may be applied to various other members to be bonded, such as a flat panel display (FPD), a mask reticle for a photomask, or the like, other than a wafer.

According to some embodiments of the present disclosure, it is possible to prevent voids from occurring between two plate-like members when the two plate-like members are bonded together.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bonding apparatus for bonding two thin plate members together, the bonding apparatus comprising:
    a first holder which holds a first thin plate member on a top surface thereof;
    a heating mechanism which is provided within the first holder;
    a second holder provided above the first holder opposite the first holder and which holds a second thin plate member on a bottom surface of the second holder;
    an exhausting mechanism which exhausts the interior of a space surrounded by the first holder and the second holder when the first holder contacts the second holder;
    a pressing mechanism which is provided on top of the second holder and presses the second holder downward;
    an annular first support including a plurality of first supporting members to support a bottom outer periphery of the first holder; and
    an annular second support including a plurality of second supporting members to support the bottom of the first support,
    wherein the second holder is configured such that one portion of the second holder is bent with a predetermined pressure,
    the second support and the first holder are fixed by one fixing member provided for each of the second supporting members, and
    the fixing member is inserted through a through hole which is formed in each of the second supporting members, the through hole having a diameter larger than a diameter of the fixing member.

2. The bonding apparatus of claim 1, further comprising an airtightness maintaining mechanism which maintains airtightness of a space between the first holder and the second holder.

3. The bonding apparatus of claim 2, wherein the airtightness maintaining mechanism includes:
    a projection which is provided along the bottom of the outer periphery of the second holder and projects downward from the bottom of the outer periphery;
    an annular sealant which is provided in the bottom of the projection and maintains airtightness of a space surrounded by the first holder, the second holder and the projection; and
    a height adjustment mechanism which is provided in the outside of the sealant and contacts the bottom of the projection in order to adjust a vertical distance between the first thin plate member and the second thin plate member.

4. The bonding apparatus of claim 1, wherein the pressing mechanism includes a vertically expandable/contractible container which is provided to cover at least the second thin plate member and presses the second holder by introducing a fluid into the container.

* * * * *